(12) United States Patent
Wu

(10) Patent No.: US 9,074,824 B2
(45) Date of Patent: Jul. 7, 2015

(54) LOW-PROFILE HEAT TRANSFER DEVICE

(75) Inventor: Chun-Ming Wu, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 709 days.

(21) Appl. No.: 13/043,485

(22) Filed: Mar. 9, 2011

(65) Prior Publication Data

US 2012/0211202 A1 Aug. 23, 2012

(30) Foreign Application Priority Data

Feb. 18, 2011 (TW) ................................. 100105388

(51) Int. Cl.
*F28D 15/02* (2006.01)
*F28D 15/04* (2006.01)
*H01L 23/427* (2006.01)

(52) U.S. Cl.
CPC .......... *F28D 15/0233* (2013.01); *F28D 15/046* (2013.01); *H01L 23/427* (2013.01); *H01L 2924/0002* (2013.01)

(58) Field of Classification Search
USPC ............. 165/104.26, 104.19, 104.21, 104.22, 165/104.33, 185
See application file for complete search history.

(56) References Cited

U.S. PATENT DOCUMENTS

| | | | | |
|---|---|---|---|---|
| 6,508,302 B2* | 1/2003 | Ishida et al. | ............. | 165/104.26 |
| 7,159,647 B2* | 1/2007 | Hsu | ......................... | 165/104.26 |
| 7,609,520 B2* | 10/2009 | Chang et al. | .................. | 361/700 |
| 8,459,340 B2* | 6/2013 | Liu et al. | .................. | 165/104.26 |
| 2001/0003308 A1* | 6/2001 | Li | ............................. | 165/104.33 |
| 2005/0098303 A1* | 5/2005 | Lindemuth et al. | ...... | 165/104.26 |
| 2006/0162905 A1* | 7/2006 | Hsu | .......................... | 165/104.26 |
| 2006/0162907 A1* | 7/2006 | Wu et al. | ................. | 165/104.26 |
| 2007/0006993 A1* | 1/2007 | Meng et al. | ............. | 165/104.26 |
| 2007/0089864 A1* | 4/2007 | Chang et al. | ............. | 165/104.26 |
| 2007/0107878 A1* | 5/2007 | Hou et al. | ................ | 165/104.26 |
| 2007/0199682 A1* | 8/2007 | Hwang et al. | ............ | 165/104.26 |
| 2007/0267179 A1* | 11/2007 | Hou et al. | ................ | 165/104.26 |
| 2007/0295494 A1* | 12/2007 | Mayer et al. | ................. | 165/170 |
| 2009/0020269 A1* | 1/2009 | Chang et al. | ............. | 165/104.26 |
| 2009/0084526 A1* | 4/2009 | Chang et al. | ............. | 165/104.26 |

* cited by examiner

*Primary Examiner* — Mohammad M Ali
*Assistant Examiner* — Raheena Rehman
(74) *Attorney, Agent, or Firm* — C. G. Mersereau; Nikolai & Mersereau, P.A.

(57) ABSTRACT

A low-profile heat transfer device includes a main body and at least one wick structure. The main body extends from a first end to a second end and defines an inner space, in which the wick structure is provided. The wick structure also extends from the first end toward the second end, such that at least one channel is defined in the inner space by the main body and the wick structure. The low-profile heat transfer device can be flexibly designed into any desired shape according to actual need, and is able to absorb heat from a heat-producing element and quickly transfer the absorbed heat to a distant location for dissipation, and therefore enables highly efficient vapor-liquid circulation therein and allows an electronic device to have excellent heat dissipation efficiency.

4 Claims, 9 Drawing Sheets

LOW-PROFILE HEAT TRANSFER DEVICE

This application claims the priority benefit of Taiwan patent application number 100105388 filed on Feb. 18, 2011.

FIELD OF THE INVENTION

The present invention relates to a low-profile heat transfer device, and more particularly to a low-profile heat transfer device that can be flexibly designed into any desired shape according to actual need and is able to quickly transfer absorbed heat to a distant location for dissipation and increase the vapor-liquid circulation rate to enable excellent heat dissipation effect.

BACKGROUND OF THE INVENTION

Due to the quick technological progress, most of the currently available electronic devices have constantly upgraded power and performance, which also results in increased amount of heat produced by the electronic devices during the operation thereof. In the event the produced heat accumulates in the electronic devices without being timely removed therefrom, the temperature inside the electronic devices will rise to adversely affect the performance of the electronic devices. In some worse condition, the accumulated heat would result in failure or damage of the electronic devices. To effectively solve the problem of heat dissipation in the electronic devices, heat transfer devices with improved heat transfer performance, such as vapor chamber and thin heat pipe, have been successively developed and introduced into market for use with heat sinks to dissipate heat in a more efficient manner.

According to the currently available thin heat pipe structure, metal powder is filled in a hollow portion of a large-diameter heat pipe and sintered to form an annular layer of wick structure on around the inner wall surface of the heat pipe. The heat pipe is then vacuumed and filled with a working fluid before being sealed and flattened to complete a thin heat pipe structure. When the heat pipe is flattened, the annular layer of wick structure formed on around the whole inner surface of the heat pipe would narrow or clog the vapor channel in the thin heat pipe to adversely affect the vapor-liquid circulation cycle therein and accordingly, result in poor heat transfer performance of the thin heat pipe.

Further, the conventional thin heat pipe is manufactured with a pipe having a fixed diameter. More specifically, the conventional thin heat pipe could not be designed into different shapes or have variable pipe diameter, such as having a larger diameter at one end and a smaller diameter at another end or having two ends with identical diameter and a diametrically expanded or narrowed middle portion, in order to meet a user's actual need. Meanwhile, the wick structure in the conventional heat pipe is uniformly and fixedly provided on around the whole inner wall surface of the heat pipe. When the resultant thin heat pipe is curved or bent to change the shape thereof, the annular layer of wick structure, i.e. the sintered metal powder, in the thin heat pipe is also bent and compressed. The bent and compressed portion of the wick structure tends to separate from the inner wall surface of the thin heat pipe to largely reduce the heat transfer performance of the thin heat pipe. Moreover, the wick structure is only formed as an annular layer on around the inner wall surface of the heat pipe without any other changes. Once the heat pipe is flattened, the annular layer of wick structure is also flattened to become two superposed layers in the thin heat pipe. The superposed layers of wick structure have a certain fixed overall thickness, which prevents the heat pipe from being flattened as much as possible. Therefore, the benefit obtainable from the conventional thin heat pipe is limited.

As to the conventional vapor chamber, it usually includes a substantially rectangular case defining an inner space, and a wick structure formed on inner wall surfaces of sidewalls of the case enclosing the inner space. A working fluid is filled in the inner space. One side of the case serves as a vaporizing zone for bearing against a heat-producing element, such as a central processing unit or a south and north bridge chipset, to absorb heat produced by the heat-producing element. The working fluid in liquid phase is heated at the vaporizing zone and converts into vapor phase. The vapor-phase working fluid flows while carries heat to a condensing zone at the other side of the case and is condensed into liquid again. The liquid-phase working fluid then flows back to the vaporizing zone by gravity or via a wick structure provided in the inner space to start another vapor-liquid circulation cycle. In this manner, it is able to effectively achieve the purpose of eliminating temperature gradient and dissipating heat.

While the conventional vapor chamber achieves the purpose of eliminating temperature gradient, it has the disadvantage of not suitable for transferring heat to a distant location for dissipation. This is because the vapor chamber absorbs heat at one side thereof and the absorbed heat is transferred to the other side via vapor-liquid phase transition of the working fluid in the case. In other words, with the vapor chamber, the elimination of temperature gradient is achieved only by transferring heat from one side to another side of the case. Therefore, the vapor chamber is only suitable for large-area uniform heat transfer but not suitable for heat transfer to a distant location.

In brief, the conventional heat transfer devices have the following disadvantages: (1) the conventional thin heat pipe could not be further reduced in its overall thickness, and could not be changed in its diameter, wick structure and shape; (2) the conventional vapor chamber could not transfer heat to a distant location for dissipation and is relatively heavy in weight; and (3) the manufacturing costs of the conventional thin heat pipe and vapor chamber are high.

It is therefore tried by the inventor to develop an improved heat transfer device to overcome the drawbacks in the conventional thin heat pipe and vapor chamber.

SUMMARY OF THE INVENTION

A primary object of the present invention is to provide a low-profile heat transfer device, which has a main body capable of quickly transferring absorbed heat to a distant location for dissipation and at least one wick structure in the main body enabling efficient vapor-liquid circulation to achieve excellent heat transfer effect.

Another object of the present invention is to provide a low-profile heat transfer device that can be manufactured at reduced cost.

A further object of the present invention is to provide a low-profile heat transfer device that has low weight and largely reduced overall thickness.

To achieve the above and other objects, the low-profile heat transfer device according to the present invention includes a main body and at least one wick structure. The main body defines an inner space and extends from a first end to a second end. The wick structure is provided in the inner space and also extends from the first end toward the second end, such that at least one channel is defined in the inner space by the main body and the wick structure. With these arrangements, the low-profile heat transfer device can quickly and effectively transfer absorbed heat to a distant location for dissipation and enable highly efficient vapor-liquid circulation.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
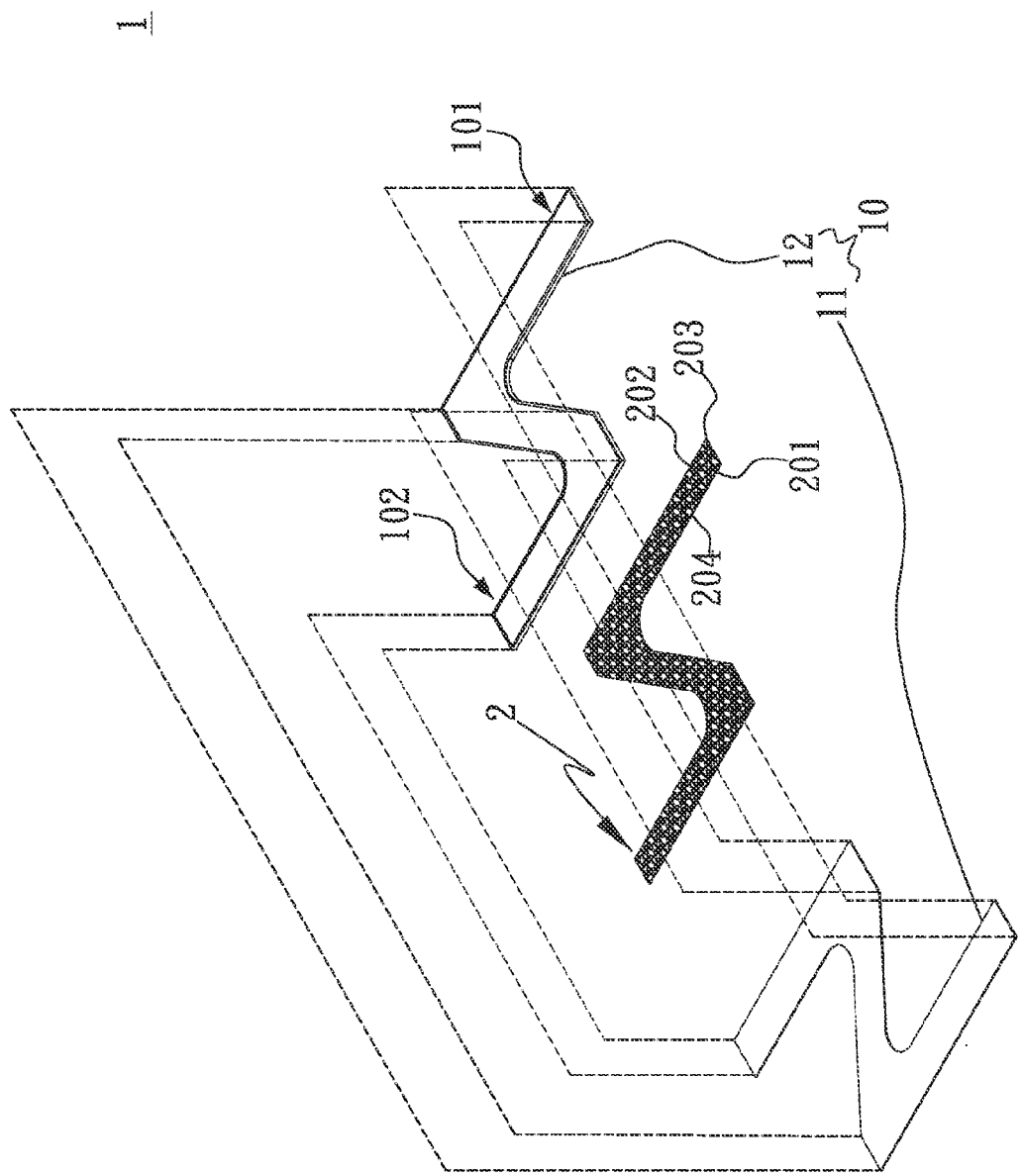
FIG. 1A is an exploded perspective view of the low-profile heat transfer device according to a first preferred embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 7:
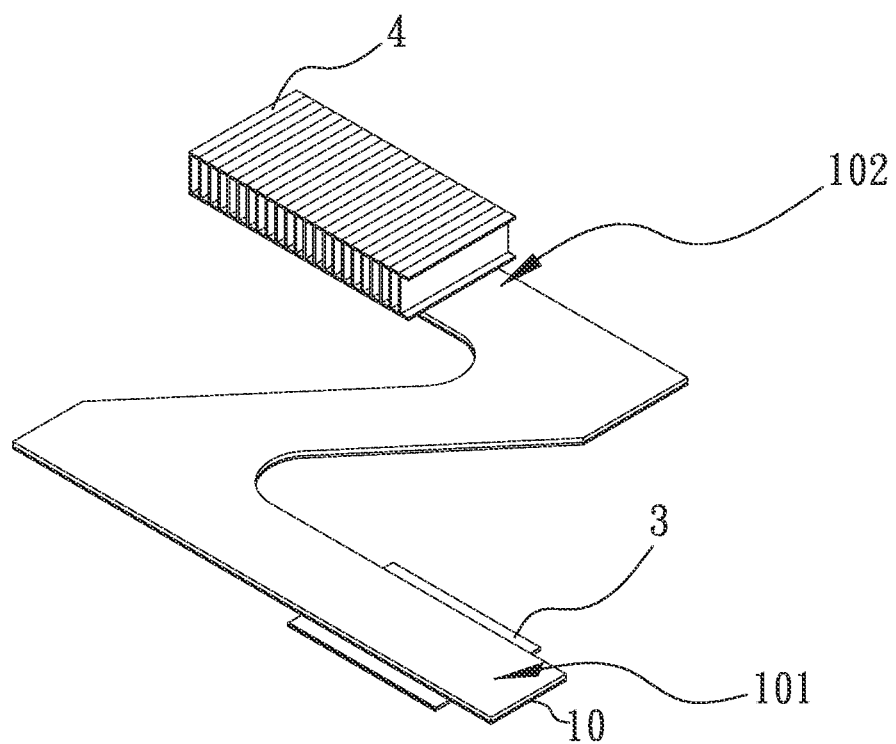
FIG. 7 is a perspective view illustrating an example of application of the low-profile heat transfer device according to the present invention.

The present invention relates to a low-profile heat transfer device 1. Please refer to FIGS. 1A, 2A, 2B and 7. The low-profile heat transfer device 1 according to a first preferred embodiment of the present invention includes a main body 10 and at least one wick structure 2. The main body 10 defines an inner space 100 and extends from a first end 101 to an opposite second end 102 of the main body 10. The main body 10 includes a first flat cover 11 and a second flat cover 12 that are correspondingly closed to each other to form the main body 10 and define the inner space 100 therebetween. As can be seen in FIG. 7, an outer face of the first flat cover 11 at the first end 101 is defined as a vaporizing zone for closely bearing against a heat-producing element 3, such as a central processing unit, a south and north bridge chipset or a graphics chip, so that heat produced by the heat-producing element 3 is transferred to the first end 101.

An outer face of the second flat cover 12 at the second end 102 is defined as a condensing zone for connecting to at least one heat sink 4, as shown in FIG. 7. While the heat sink 4 illustrated in FIG. 7 is in the form of a plurality of stacked radiation fins, it is understood the heat sink 4 is not limited thereto but may be in other different forms, such as an extruded aluminum heat sink or other types of bodies capable of dissipating heat therefrom.

Figure 2A:
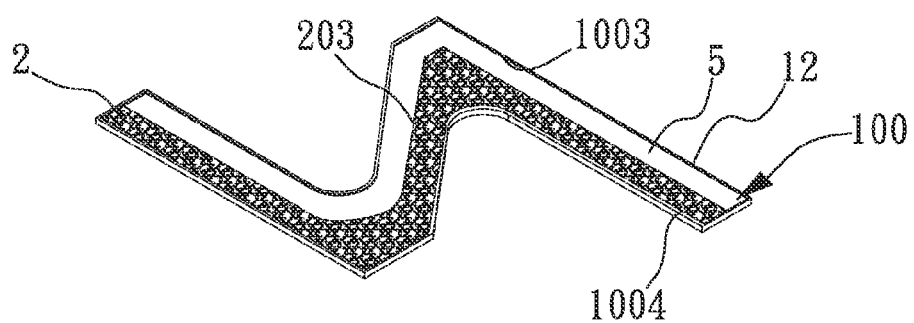
FIG. 2A is a top perspective view showing the second flat cover and the wick structure for the low-profile heat transfer device according to the first preferred embodiment of the present invention.
Figure 2B:
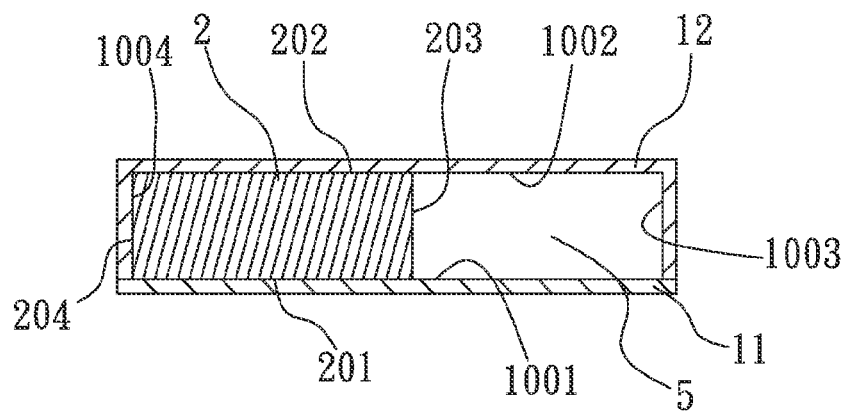
FIG. 2B is a cross-sectional view of the low-profile heat transfer device according to the first preferred embodiment of the present invention.

As can be seen in FIG. 2B, the inner space 100 defined in the main body 10 between the first and second flat covers 11, 12 is enclosed by four continuously connected sidewalls, namely, a first sidewall 1001, a second sidewall 1002 opposite to the first sidewall 1001, a third sidewall 1003, and a fourth sidewall 1004 opposite to the third sidewall 1003. A working fluid is filled in the space 100. While the preferred embodiments of the present invention will be explained with water as the working fluid, it is understood any fluid that can be advantageously vaporized to dissipate heat, such as purified water, inorganic compounds, alcohol, ketones, liquid metals, coolant, organic compounds, or any mixture thereof.

The first end 101 is an end of the main body 10 while the second end 102 is another end of the main body 10. In designing the present invention, the first flat cover 11 and the second flat cover 12 of the main body 10 as well as the wick structure 2 can extend from the first end 101 to the second end 102 by a length, in a width and in a shape determined according to a position at where the low-profile vapor chamber 1 is to be mounted as well as the requirement for transferring heat to a distal location. For example, the first and second flat covers 11, 12 illustrated in FIG. 1A are substantially Z-shaped, and the wick structure 2 also has a Z-shape matching that of the first and second flat covers 11, 12. However, it is understood the main body 10 and the wick structure 2 are not necessarily Z-shaped but may also be curve-shaped, L-shaped, or in any other suitable shape.

Please refer to FIGS. 2A and 2B along with FIG. 1A. The wick structure 2 is provided in the main body 10, such that the wick structure 2 and the main body 10 together define a channel 5 in the inner space 100 for the working fluid in vapor phase to flow therethrough. The wick structure 2 extends in the inner space 100 from the first end 101 toward the second end 102, as shown in FIG. 2A; and has a first side 201, a second side 202 opposite to the first side 201, a third side 203, and a fourth side 204 opposite to the third side 203, as shown in FIG. 2B. In the illustrated first preferred embodiment, the wick structure 2 is located adjacent to the fourth sidewall 1004 with the first side 201 and the second side 202 respectively bearing against the first sidewall 1001 and the second sidewall 1002, and the fourth side 204 closely bearing against the fourth sidewall 1004. Alternatively, in a variant of the first preferred embodiment not shown in the accompanying drawings, the wick structure 2 may be located adjacent to the third sidewall 1003 with the first side 201 and the second side 202 respectively bearing against the first sidewall 1001 and the second sidewall 1002, and the third side 203 closely bearing against the third sidewall 1003.

The wick structure 2 in the main body 10 has many functions, such as providing flow-guiding ability, providing more return channels, and serving as a supporting structure in the space 100. According to the embodiments of the present invention, the wick structure 2 may present in three different types, which will be described in more details below.

The wick structure 2 in the first type is a sintered powder body. The wick structure 2 in the second type is a flat metal body having a wick structure formed thereon; the flat metal body can be made of any one of aluminum, copper, silver, and any alloy thereof; and the wick structure formed on the flat metal body can be selected from the group consisting of meshes, fibers, sintered powder, a combination of meshes and sintered powder, and grooves. The wick structure 2 in the third type includes a plurality of flat metal bodies each having an annular sintered powder body formed around outer peripheral edges thereof; and the flat metal bodies can also be made of any one of aluminum, copper, silver, and any alloy thereof.

The working manner of the low-profile heat transfer device according to the first preferred embodiment of the present invention is now described with one example as below:

Please refer to FIGS. 1A, 2A and 7. When the heat-producing element 3 produces heat, the produced heat is transferred to the first flat cover 11 and absorbed by the working fluid in the inner space 100 at the vaporizing zone of the first flat cover 11, so that the working fluid vaporizes and converts into vapor phase. Since the second end 102 has a relatively lower temperature than the first end 101, the vapor-phase working fluid flows along the channel 5 toward the second end 102. Therefore, the produced heat is transferred not only from the vaporizing zone on the first flat cover 11 to the condensing zone on the second flat cover 12, but also from the first end 101 to the second end 102 of the main body 10. The heat sink 4 connected to the second flat cover 12 at the second end 102 of the main body 10 will further transfer the absorbed heat to the radiation fins thereof for dissipating into ambient environment, so as to increase the efficiency of cooling the vapor-phase working fluid at the condensing zone on the second flat cover 12 corresponding to the second end 102 of the main body 10, allowing the vapor-phase working fluid to quickly convert into liquid-phase working fluid again and flow back via the wick structure 2 to the vaporizing zone on the first flat cover 11 corresponding to the first end 101 of the main body 10 to start another vapor-liquid circulation cycle. In this manner, it is able to achieve highly efficient vapor-liquid circulation and transfer the absorbed heat to a distant location for dissipation, so as to achieve excellent heat dissipation effect.

Figure 2C:
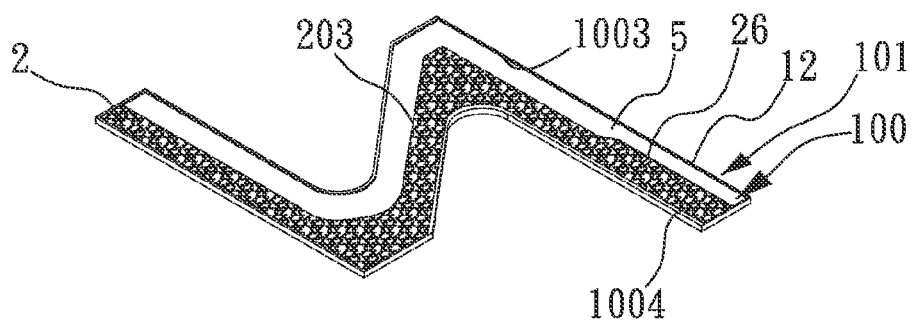
FIG. 2C is a top perspective view showing a variant of the wick structure for the low-profile heat transfer device according to the first preferred embodiment of the present invention.

Please refer to FIG. 2C that is a top perspective view showing a variant of the wick structure 2 for the low-profile heat transfer device according to the first preferred embodiment of the present invention. In this variant, an end of the wick structure 2 adjoining the first end 101 of the main body is provided with at least one expanded portion 26, which sidewardly protrudes into the channel 5. The expanded portion 26 illustrated in FIG. 2C sidewardly protrudes from the third side 203 of the wick structure 2 into the channel 5. Alternatively, in the case the wick structure 2 is located adjacent to the third sidewall 1003 of the inner space 100, the expanded portion 26 sidewardly protrudes from the fourth side 204 into the channel 5.

Figure 1B:
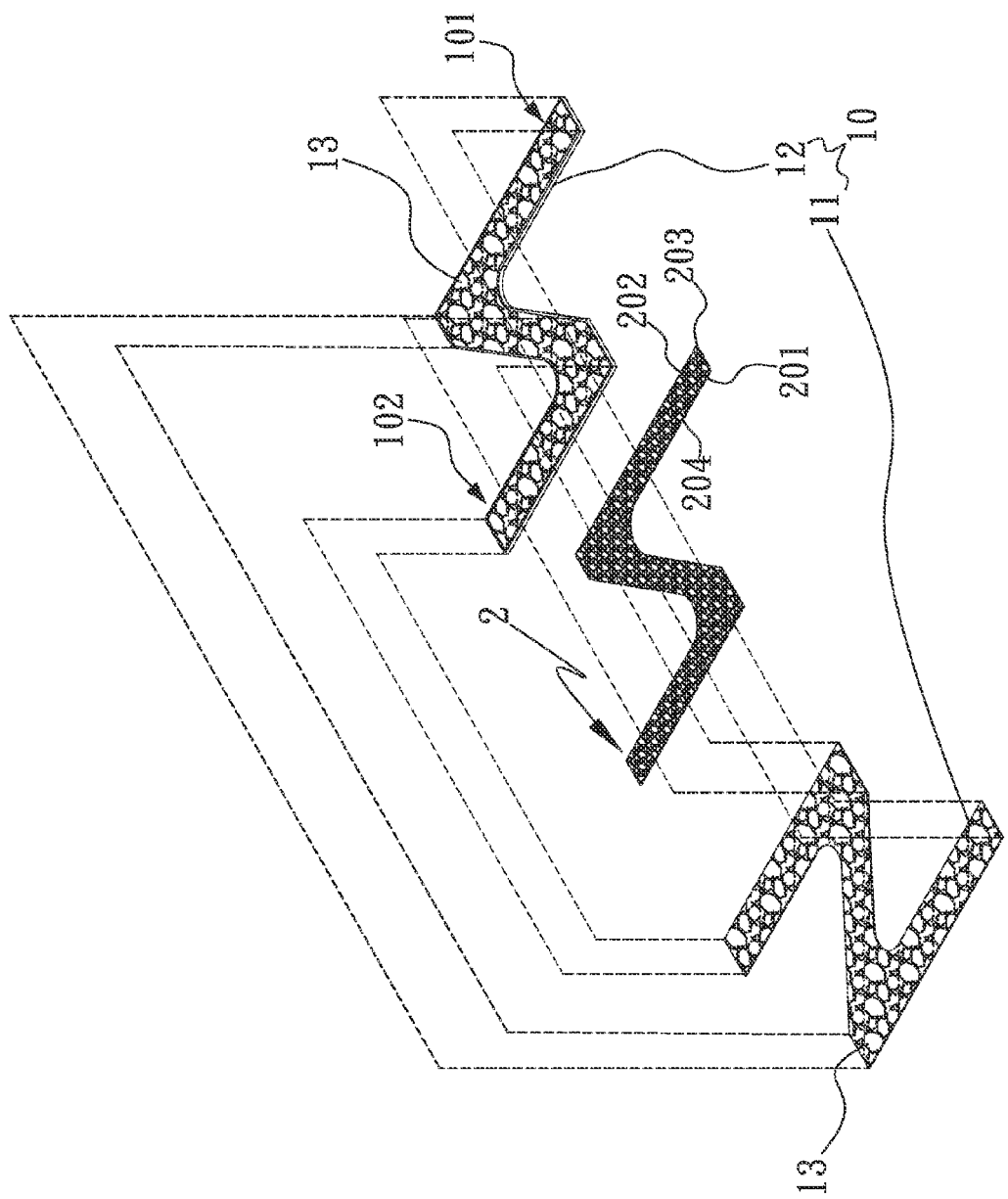
FIG. 1B is an exploded perspective view showing a variant of first and second flat covers for the low-profile heat transfer device according to the first preferred embodiment of the present invention.

FIG. 1B is an exploded perspective view showing a variant of the first and second flat covers 11, 12 for of the low-profile heat transfer device 1 according to the first preferred embodiment of the present invention. The illustrated variant of the first and the second flat cover 11, 12 are provided on respective inner face with an additional wick structure 13 for assisting the liquid-phase working fluid to flow back to the vaporizing zone more quickly, so as to enable further increased vapor-liquid circulation rate.

Figure 2D:
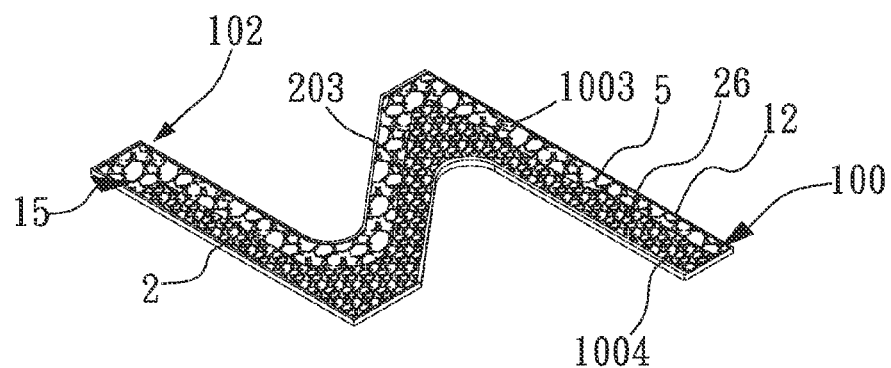
FIG. 2D is a top perspective view showing the variant of the second flat cover and the variant of the wick structure for the low-profile heat transfer device according to the first preferred embodiment of the present invention.

The additional wick structure 13 can be selected from the group consisting of meshes, fibers, sintered powder, a combination of meshes and sintered powder, and grooves. Please refer to FIG. 2D that is a top perspective view showing the variant of the second flat cover 12 and the variant of the wick structure 2 for the low-profile heat transfer device according to the first preferred embodiment of the present invention. As shown, a small space 15 is left between the second end 102 and another end of the variant of the wick structure 2 opposite to the expanded portion 26, and the small space 15 is communicable with the channel 5.

With the above arrangements, the low-profile heat transfer device 1 according to the present invention has the function of transferring heat to a distant location for dissipation, which enables largely upgraded heat dissipation effect. Moreover, the low-profile heat transfer device of the present invention can be flexibly designed according to actual need, and has the advantages of low weight, largely reduced overall thickness and reduced manufacturing cost.

Figure 3A:
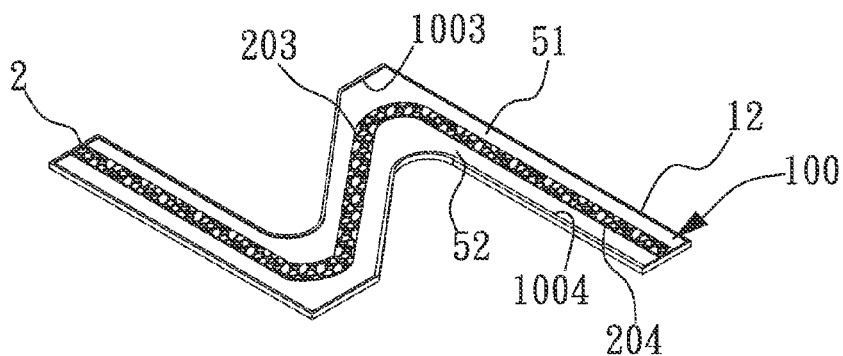
FIG. 3A is a top perspective view showing the second flat cover and the wick structure for the low-profile heat transfer device according to a second preferred embodiment of the present invention.
Figure 3B:
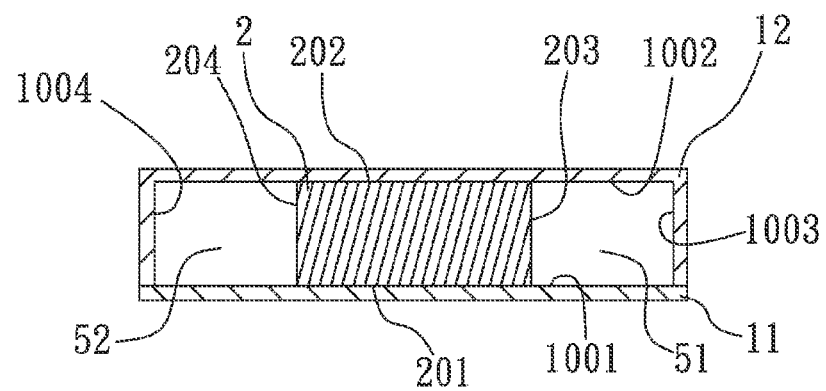
FIG. 3B is a cross-sectional view of the low-profile heat transfer device according to the second preferred embodiment of the present invention.
Figure 4A:
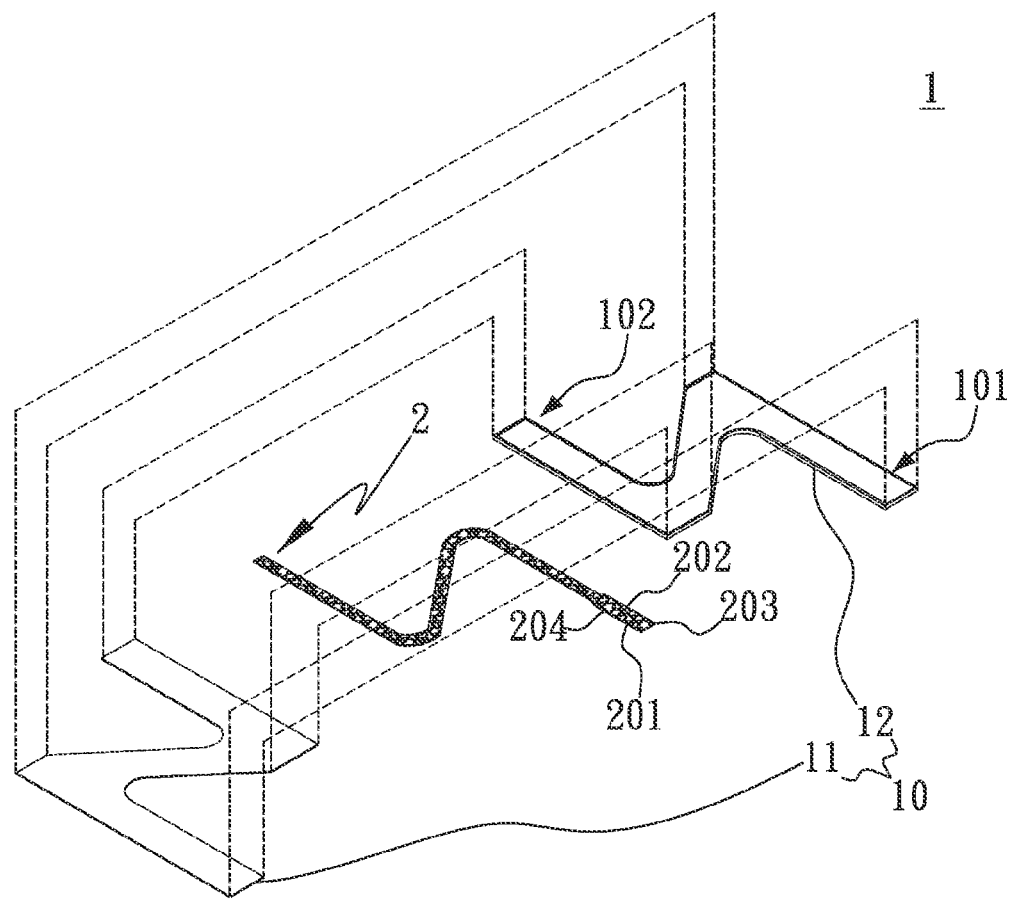
FIG. 4A is an exploded perspective view of the low-profile heat transfer device according to the second preferred embodiment of the present invention.

Please refer to FIGS. 3A, 3B and 4A, in which the low-profile heat transfer device according to a second preferred embodiment of the present invention is shown. The second preferred embodiment is generally structurally and functionally similar to the first preferred embodiment, except that the wick structure 2 in the second embodiment is longitudinally located at a middle position of the inner space 100 in the main body 10 to define a first channel 51 between the third side 203 of the wick structure 2 and the third sidewall 1003 as well as a second channel 52 between the fourth side 204 of the wick structure 2 and the fourth sidewall 1004. The vapor-phase working fluid flows through the first and second channels 51, 52 and is divided into two parts. With this design, the vapor-phase working fluid could more quickly flow along the first and the second channel 51, 52 toward the second end 102 to enable effectively increased efficiency of heat transfer to a distant location for dissipation.

Figure 3C:
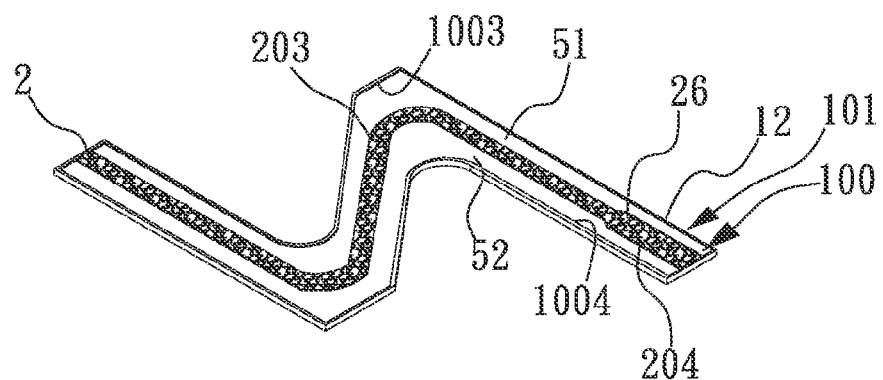
FIG. 3C is a top perspective view showing a variant of the wick structure for the low-profile heat transfer device according to the second preferred embodiment of the present invention.

FIG. 3C shows a variant of the wick structure 2 for the low-profile heat transfer device according to the second preferred embodiment of the present invention. In this variant, an end of the wick structure 2 adjoining the first end 101 of the main body is provided with at least one expanded portion 26, which sidewardly protrudes from both the third side 203 and the fourth side 204 into the first channel 51 and the second channel 52, respectively.

Figure 4B:
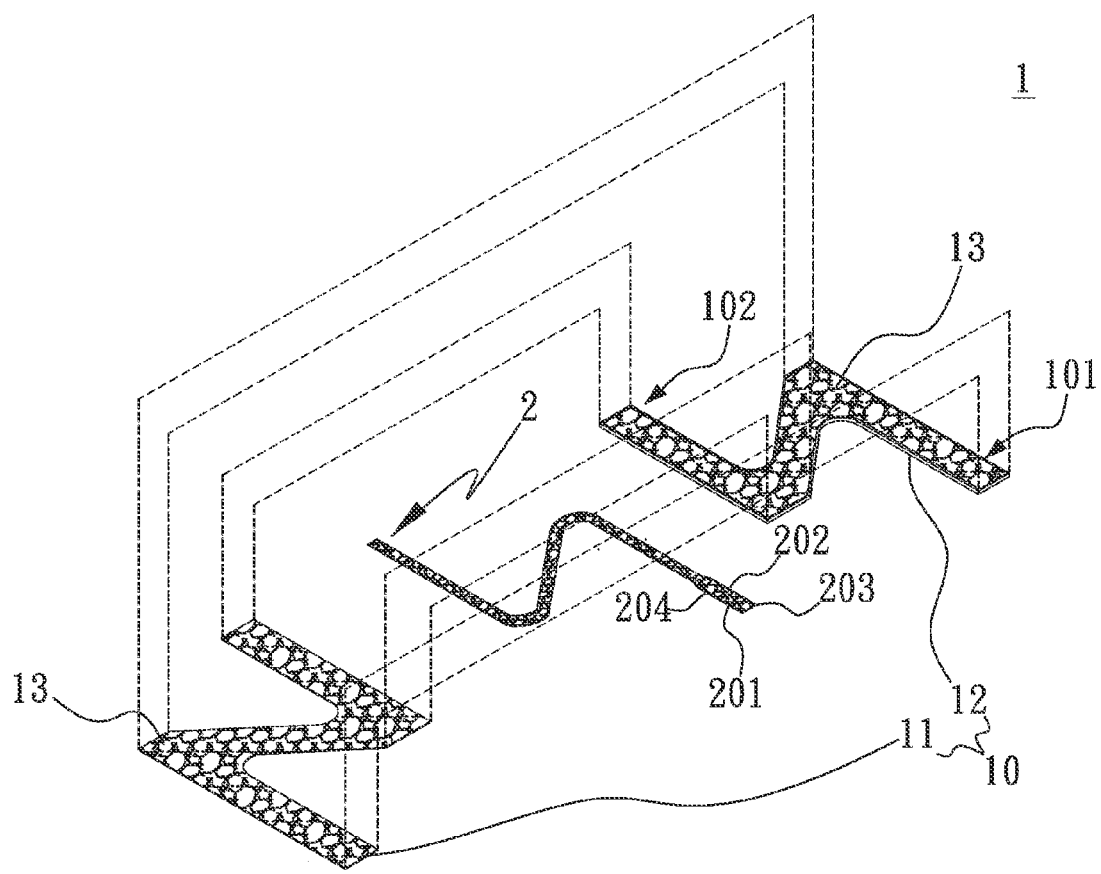
FIG. 4B is an exploded perspective view showing a variant of the first and second flat covers for the low-profile heat transfer device according to the second preferred embodiment of the present invention.
Figure 4C:
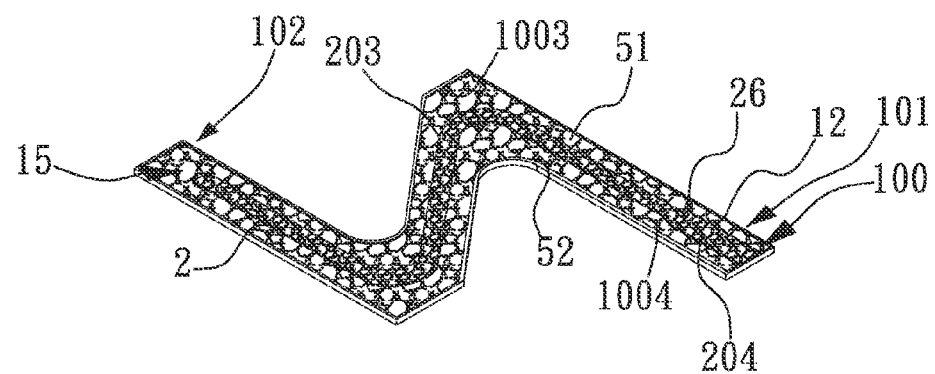
FIG. 4C is a top perspective view showing the variant of the second flat cover and the variant of the wick structure for the low-profile heat transfer device according to the second preferred embodiment of the present invention.

FIG. 4B is an exploded perspective view showing a variant of the first and second flat covers 11, 12 for the low-profile heat transfer device 1 according to the second preferred embodiment of the present invention. In the illustrated variant, the first and the second flat cover 11, 12 are provided on respective inner face with an additional wick structure 13 for assisting the liquid-phase working fluid to flow back to the vaporizing zone more quickly, so as to further enable highly efficient vapor-liquid circulation. The additional wick structure 13 can be selected from the group consisting of meshes, fibers, sintered powder, a combination of meshes and sintered powder, and grooves. Please refer to FIG. 4C that is a top perspective view showing the variant of the second flat cover 12 and the variant of the wick structure 2 for the low-profile heat transfer device according to the second preferred embodiment of the present invention. As shown, a small space 15 is left between the second end 102 and another end of the variant of the wick structure 2 opposite to the expanded portion 26, and the small space 15 is communicable with the first and second channels 51, 52.

Figure 5A:
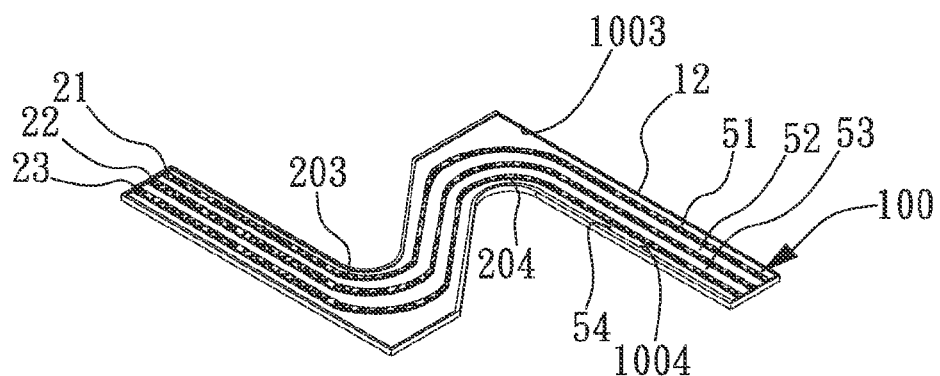
FIG. 5A is a top perspective view showing the second flat cover and the wick structure for the low-profile heat transfer device according to a third preferred embodiment of the present invention.
Figure 5B:
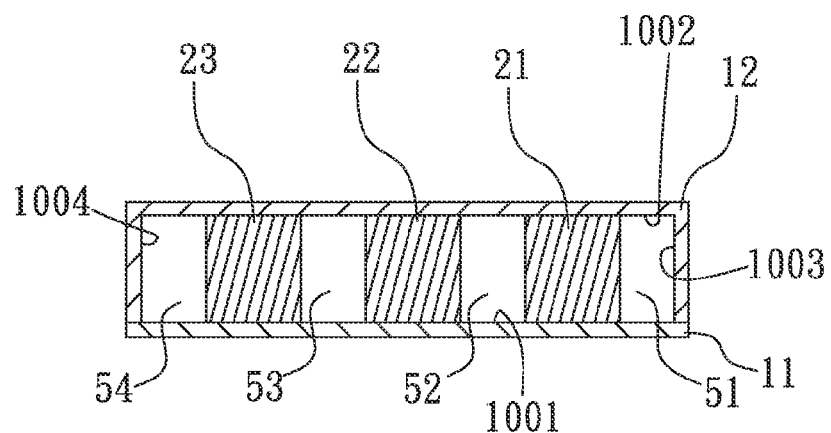
FIG. 5B is a cross-sectional view of the low-profile heat transfer device according to the third preferred embodiment of the present invention.

Please refer to FIGS. 5A and 5B, in which the low-profile heat transfer device according to a third preferred embodiment of the present invention is shown. The third preferred embodiment is generally structurally and functionally similar to the first preferred embodiment, except that the third embodiment includes a first, a second and a third wick structure 21, 22, 23, which are arranged in the inner space 100 to longitudinally space from one another, such that a first channel 51 is defined between the first wick structure 21 and the third sidewall 1003, a second channel 52 is defined between the first wick structure 21 and the second wick structure 22, a third channel 53 is defined between the second wick structure 22 and the third wick structure 23, and a fourth channel 54 is defined between the third wick structure 23 and the fourth sidewall 1004.

The vapor-phase working fluid flows through the first, the second, the third and the fourth channel 51, 52, 53, 54 and is divided into four parts. With this design, the vapor-phase working fluid could more quickly flow along the first, the second, the third, and the fourth channel 51, 52, 53, 54 toward the second end 102, and the liquid-phase working fluid could more quickly flow back to the vaporizing zone via the first, the second and the third wick structure 21, 22, 23, enabling highly efficient vapor-liquid circulation as well as effectively increased efficiency in heat transfer to a distant location for dissipation.

Figure 5C:
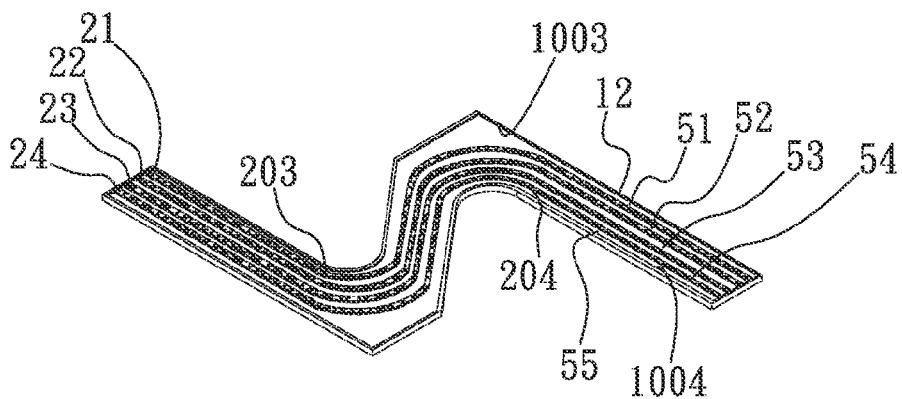
FIG. 5C is another top perspective view showing the second flat cover and the wick structure for the low-profile heat transfer device according to the third preferred embodiment of the present invention.

In practical implementation of the third preferred embodiment of the present invention, the number of the wick structures is not necessarily limited to three. A user may determine the number of the wick structures in advance according to the width of the main body 10, the required heat transfer efficiency, and the required vapor-liquid circulation rate. For example, as shown in FIG. 5C, four wick structures are provided and spaced in the space 100. That is, a fourth wick structure 24 can be further included and arranged between the third wick structure 23 and the fourth sidewall 1004, so that the fourth channel 54 is defined between the third and the fourth wick structure 23, 24, and a fifth channel 55 is further defined between the fourth wick structure 24 and the fourth sidewall 1004. Since the fifth channel 55 is functionally the same as the first to the fourth channel 51-54, it is not repeatedly discussed herein.

Figure 5D:
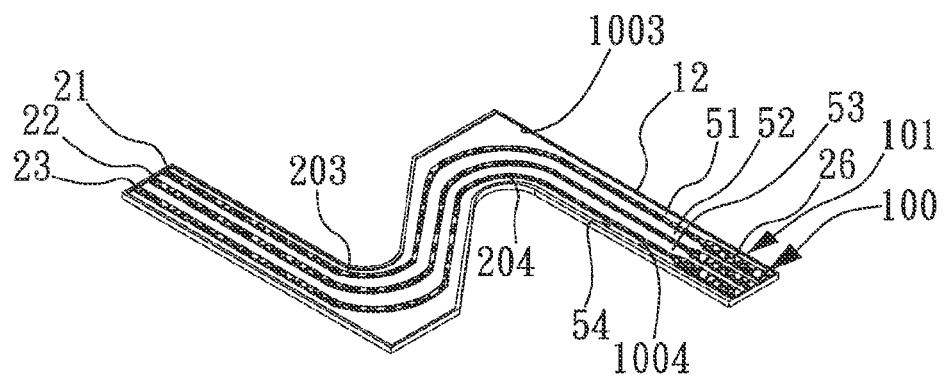
FIG. 5D is a top perspective view showing the second flat cover and a variant of the wick structure for the low-profile heat transfer device according to the third preferred embodiment of the present invention.

FIG. 5D shows a variant of the first, the second and the third wick structure 21, 22, 23 for the low-profile heat transfer device according to the third preferred embodiment of the present invention. In this variant, an end of each of the first, second and third wick structures 21, 22, 23 adjoining the first end 101 of the main body is provided with at least one expanded portion 26, which sidewardly protrudes from two opposite lateral sides of the corresponding wick structure into two adjoining channels. More specifically, the expanded portion 26 of the first wick structure 21 sidewardly protrudes into the first and the second channels 51, 52, the expanded portion 26 of second wick structure 22 sidewardly protrudes into the second and the third channels 52, 53, while the third wick structure 23 sidewardly protrudes into the third and the fourth channels 53, 54.

Figure 6A:
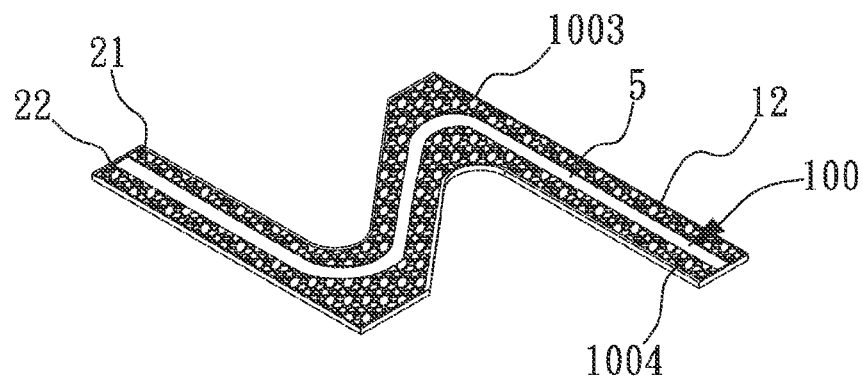
FIG. 6A is a top perspective view showing the second flat cover and the wick structure for the low-profile heat transfer device according to a fourth preferred embodiment of the present invention.
Figure 6B:
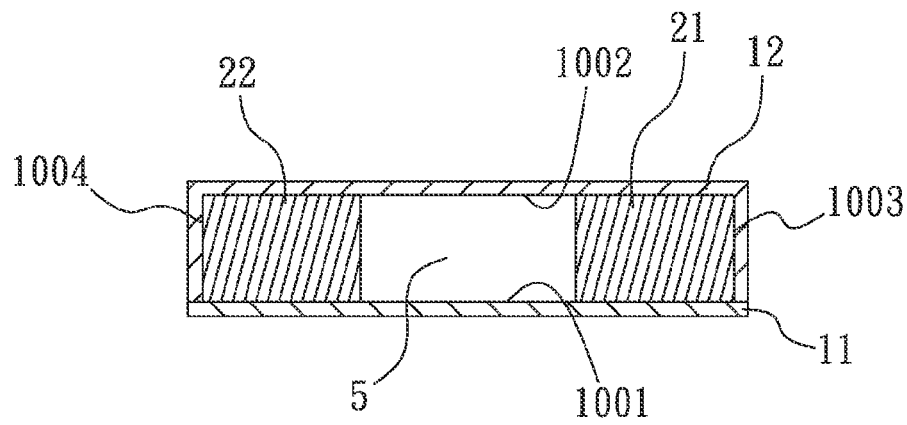
FIG. 6B is a cross-sectional view of the low-profile heat transfer device according to the fourth preferred embodiment of the present invention.

FIGS. 6A and 6B show a low-profile heat transfer device according to a fourth preferred embodiment of the present invention. The fourth preferred embodiment is generally structurally and functionally similar to the first preferred embodiment, except that the fourth preferred embodiment includes a first wick structure 21 and a second wick structure 22 longitudinally located opposite to the first wick structure 21.

The first and the second wick structure 21, 22 are spaced from each other in the inner space 100 to locate adjacent to the third sidewall 1003 and the fourth sidewall 1004, respectively, so that the channel 5 is defined in the inner space 100 between the first and the second structure 21, 22.

The first and the second wick structure 21, 22 arranged in the manner as described in the fourth preferred embodiment of the present invention enable the liquid-phase working fluid to quickly flow back to the vaporizing zone, so as to increase vapor-liquid circulation rate and achieve the effect of heat transfer to a distant location for dissipation.

Figure 6C:
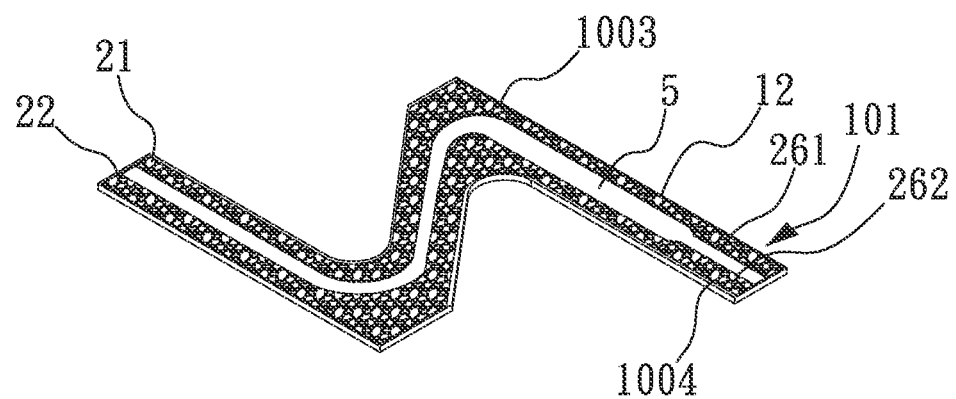
FIG. 6C is a top perspective view showing a variant of the wick structure for the low-profile heat transfer device according to the fourth preferred embodiment of the present invention.

FIG. 6C shows a variant of the first and the second wick structure 21, 22 in the fourth preferred embodiment of the present invention. In this variant, the first and the second wick structure 21, 22 are provided at respective one end adjoining the first end 101 with a first expanded portion 261 and a second expanded portion 262, respectively. The first expanded portion 261 sidewardly protrudes into the channel 5 toward the second expanded portion 262, and the second expanded portion 262 sidewardly protrudes into the channel 5 toward the first expanded portion 261.

With the above arrangements, the low-profile heat transfer device 1 according to the present invention can be flexibly designed to meet actual need, and may have low weight and a reduced overall thickness the same as or smaller than that of the conventional vapor chamber. Further, the low-profile heat transfer device according to the present invention provides the same function as the conventional heat pipe to quickly transfer heat to a distant location for dissipation. Therefore, the present invention combines the features of vapor chamber and heat pipe for an electronic device to have excellent heat dissipation effect, and has effectively reduced manufacturing cost.

In conclusion, the present invention is superior to the conventional heat transfer devices due to the following advantages: (1) providing excellent heat dissipation effect; (2) having low weight and low profile while enabling heat transfer to a distant location; (3) requiring only reduced manufacturing cost; (4) having highly efficient vapor-liquid circulation; and (5) allowing flexible design thereof.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A low-profile heat transfer device, comprising:
a main body defining an inner space and extending from a first end to an opposite second end, and the first end defined as a vaporizing zone, the second end defined as a condensing zone; and
a single wick structure provided in the inner space of the main body, such that the wick structure and the main body together define a first channel and a second channel in the inner space; and the wick structure also extends in the inner space from the vaporizing zone first end toward the condensing zone second end;
wherein the wick structure has a first section located at the vaporizing zone and a second section located at the condensing zone, the first section being provided with at least one expanded portion, and the expanded portion sidewardly protruding from at least one lateral side of the wick structure into the at least one channel, so that a volume of the first section of the wick structure is larger than a volume of the second section of the wick structure;
wherein the inner space in the main body is enclosed by a first sidewall, a second sidewall opposite to the first sidewall, a third sidewall, and a fourth sidewall opposite to the third sidewall;
wherein the inner space has a working fluid filled therein;
wherein the wick structure has a first side, a second side opposite to the first side, a third side, and a fourth side opposite to the third side; the first and the second side of the wick structure being in contact with the first sidewall and the second sidewall, respectively, the third side of the wick structure and the third sidewall together defining the first channel therebetween, and the fourth side of the wick structure and the fourth sidewall together defining the second channel therebetween; and
wherein the expanded portion sidewardly protrudes from the third and the fourth side of the wick structure into the first and the second channel, respectively.

2. A low-profile heat transfer device, comprising:
a main body defining an interior space and extending from a first end to an opposite second end, and the first end defined as a vaporizing zone, the second end defined as a condensing zone, wherein the inner space in the main body is enclosed by a first sidewall, a second sidewall opposite to the first sidewall, a third sidewall, and a fourth sidewall opposite to the third sidewall;
a first wick structure, a second wick structure, and a third wick structure provided in the inner space; the first wick structure and the third sidewall together defining a first channel therebetween, the first wick structure and the second wick structure together defining a second channel therebetween, the second wick structure and the third wick structure together defining a third channel therebetween, and the third wick structure and the fourth sidewall together defining a fourth channel therebetween; and the first wick structure, the second wick structure, and the third wick structure also extending in the inner space from the vaporizing zone first end toward the condensing zone second end;
wherein the first wick structure, the second wick structure, and the third wick structure have a first section and a second section, respectively, the first section located at the vaporizing zone and the second section located at the condensing zone;
wherein the inner space has a working fluid filled therein; and
wherein the first, the second and the third wick structure are provided at respective first section with at least one expanded portion; and the expanded portion on each of the first, second and third wick structures sidewardly protruding from two opposite lateral sides of the corresponding wick structure into two adjoining channels, so that a volume of the first section on each of the first, second and third wick structures are larger than a volume of the second section on each of the first, second and third wick structures.

3. A low-profile heat transfer device, comprising:
a main body defining an inner space and extending from a first end to an opposite second end, and the first end defined as a vaporizing zone, the second end defined as a condensing zone; wherein the inner space in the main body is enclosed by a first sidewall, a second sidewall opposite to the first sidewall, a third sidewall, and a fourth sidewall opposite to the third sidewall;
a first wick structure and a second wick structure are provided in the inner space of the main body; the second wick structure being longitudinally located opposite to and spaced from the first wick structure; and the first and the second wick structure being located adjoining the third sidewall and the fourth sidewall, respectively, so that one channel is defined in the inner space between the first and the second wick structure; and the first wick structure and the second wick structure also extends in the inner space from the vaporizing zone first end toward the condensing zone second end;
wherein the first wick structure and the second wick structure have a first section and a second section respectively, the first section located at the vaporizing zone and the second section located at the condensing zone;
wherein the inner space has a working fluid filled therein;
wherein the first wick structure is provided at first section with a first expanded portion, and the first expanded portion located at the vaporizing zone and sidewardly protruding into the channel, so that a volume of the first section on each of the first and the second wick structures is larger than a volume of the second section on each of the first and the second wick structures.

4. The low-profile heat transfer device as claimed in claim 3, wherein the second wick structure is provided at an end with a second expanded portion, and the second expanded portion located at the vaporizing zone and sidewardly protruding into the channel toward the first expanded portion.

* * * * *